US006855370B2

(12) United States Patent
Mocella et al.

(10) Patent No.: US 6,855,370 B2
(45) Date of Patent: Feb. 15, 2005

(54) FLUOROPOLYMER INTERLAYER DIELECTRIC BY CHEMICAL VAPOR DEPOSITION

(75) Inventors: Michael Mocella, Chadds Ford, PA (US); Andrew E. Feiring, Wilmington, DE (US); Theodore A. Treat, Washington, WV (US); Yakov Brichko, Mountain View, CA (US); Eugene Lopata, Scotts Valley, CA (US); Peter Rose, Boulder Creek, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 125 days.

(21) Appl. No.: 10/137,875

(22) Filed: May 2, 2002

(65) Prior Publication Data

US 2002/0182321 A1 Dec. 5, 2002

Related U.S. Application Data

(60) Provisional application No. 60/288,653, filed on May 4, 2001.

(51) Int. Cl.⁷ .............................................. C23C 16/00
(52) U.S. Cl. ................. 427/255.6; 427/99; 427/255.28; 427/490; 427/497
(58) Field of Search ....................... 427/58, 99, 255.28, 427/255.6, 490, 497

(56) References Cited

U.S. PATENT DOCUMENTS

| | | | |
|---|---|---|---|
| 3,304,293 A | | 2/1967 | Fuhrmann et al. |
| 4,834,022 A | * | 5/1989 | Mahawili ..................... 118/725 |
| 5,268,202 A | | 12/1993 | You et al. |
| 5,288,528 A | | 2/1994 | Blanchet-Fincher |
| 5,683,516 A | * | 11/1997 | DeDontney et al. ......... 118/718 |
| 5,851,294 A | * | 12/1998 | Young et al. ................ 118/715 |
| 5,981,673 A | * | 11/1999 | DeSimone et al. ........... 526/89 |
| 6,022,414 A | * | 2/2000 | Miller et al. ................. 118/718 |
| 6,632,470 B2 | * | 10/2003 | Morra et al. ................ 427/2.24 |

FOREIGN PATENT DOCUMENTS

JP        08255341      10/1996

OTHER PUBLICATIONS

RD 347001, Mar., 1993.

* cited by examiner

Primary Examiner—Brian K. Talbot
(74) Attorney, Agent, or Firm—James E. Shipley

(57) ABSTRACT

A process is disclosed for forming a fluoropolymer layer on a thin film device, comprising contacting said thin film device with a gas phase fluoromonomer, and initiating polymerization of said fluoromonomer with a free radical polymerization initiator whereby said fluoromonomer polymerizes to form said fluoropolymer layer on said thin film device.

8 Claims, No Drawings

FLUOROPOLYMER INTERLAYER DIELECTRIC BY CHEMICAL VAPOR DEPOSITION

The appln. claims benefit of 60/288,653 May 4, 2001.

BACKGROUND OF THE INVENTION

Modern electronic thin-film devices use layers of conductors and insulators as the current-carrying structures of such devices. The dielectric (insulator) layers are often composed of silicon-containing materials such as silicon dioxide and silicon nitride. As the requirements of such devices become more demanding, there is a need for improved dielectric materials, having lower dielectric constants compared to the silicon-containing materials.

Fluoropolymers can have excellent dielectric properties. However, the methods to deposit thin films of such polymers are limited. In certain cases, the polymers can be made soluble in selected solvents, and so thin films can be formed by processes commonly used for, e.g. photoresist materials. However, the attributes of the polymer to produce solubility may not be the most desirable ones for dielectric applications. In other cases, emulsions or slurries of fine polymer particles can be applied to the device, and films produced by removing the solvent carrier and then heat treating the particles to produce a film. However, forming a uniform film by such methods with the desired properties may not be straightforward.

Therefore, it would be desirable to have alternative methods to form the fluoropolymer layers. In particular, thin-film-processing industries frequently use chemical vapor deposition methods to deposit the present dielectric materials It would thus be particularly desirable to have chemical vapor deposition means for fluoropolymer dielectric deposition.

SUMMARY OF THE INVENTION

A process for forming a fluoropolymer layer on a thin film device has been discovered comprising:
- a.) contacting said thin film device with a gas phase fluoromonomer, and
- b.) initiating polymerization of said fluoromonomer with a free radical polymerization initiator, whereby said fluoromonomer polymerizes to form said fluoropolymer layer on said thin film device.

A process for forming a fluoropolymer layer on a thin film device has been discovered comprising:
- a.) delivering a gas phase fluoromonomer to said thin film device
- b.) contacting said thin film device with said gas phase fluoromonomer, and
- c.) initiating polymerization of said fluoromonomer with a free radical polymerization initiator, whereby said fluoromonomer polymerizes to form said fluoropolymer layer on said thin film device.

A process for forming a fluoropolymer layer on a thin film device has been discovered comprising:
- a.) delivering a gas phase fluoromonomer and a gas phase free radical polymerization initiator to said thin film device,
- b.) mixing said gas phase fluoromonomer and said gas phase free radical polymerization initiator to form a gas phase mixture of said fluoromonomer and said free radical polymerization initiator,
- c.) contacting said thin film device with said gas phase mixture of said fluoromonomer and said free radical polymerization initiator, and
- d.) initiating polymerization of said fluoromonomer with said free radical polymerization initiator, whereby said fluoromonomer polymerizes to form said fluoropolymer layer on said thin film device.

DETAILED DESCRIPTION

The present invention is a process for forming a fluoropolymer layer on a thin film device, comprising contacting said thin film device with a gas phase fluoromonomer and initiating polymerization of said fluoromonomer with a free radical polymerization initiator, whereby said fluoromonomer polymerizes to form said fluoropolymer layer on said thin film device.

Fluoropolymers comprising the fluoropolymer layers formed by the present process are comprised of repeating units from fluoromonomers defined herein and may have a number averaged molecular weight of over 10,000. Fluoropolymer layers produced by the process of the present invention have a uniform thickness and are typically from about 500 angstroms to about 50,000 angstroms thick.

Thin film devices on which fluoropolymer layers may be formed by the present process comprise devices known in the microelectronics industry as semiconductor wafers, integrated circuits, flat panel displays, micromechanical devices, microelectrical mechanical systems, and thin film optical and optoelectrical devices. The surface of such thin film devices on which a fluoropolymer layer may be formed by the present process include: silicon; silicon dioxide; silicon nitride; silicon oxynitride; silicon carbide; "carbon doped" oxides (e.g. spin-on materials such as HSQ and MSQ, as well as CVD materials such as Coral™ and Black Diamond™); phosphosilicate, borosilicate and borophosphosilicate glass; polyimides; aluminum; copper; tungsten; molybdenum; titanium; tantalum; suicides and nitrides of aluminum, copper, tungsten, molybdenum, titanium and tantalum; and conductive alloys of aluminum, copper, tungsten, molybdenum, titanium, and tantalum, including aluminum doped with copper and/or silicon.

Fluoromonomers useful in the present process for forming fluoropolymer layers contain carbon-carbon unsaturation and may include the elements carbon, fluorine, hydrogen, oxygen, nitrogen, sulfur and phosphorous. The fluoromonomers preferably comprise the elements carbon, fluorine and oxygen and most preferably comprise the elements carbon and fluorine. A mixture of fluoromonomers may be used in the present process to produce co-, ter- or tetrafluoropolymers. The fluoromonomers are preferably homopolymerizable, but non-homopolymerizable fluoromonomers may be used together with homopolymerizable fluoromonomers to modify the properties of the fluoropolymer layer.

Homopolymerizable fluoromonomers of the present invention include:
- fluoroethylenes represented by the formula $C_2H_xF_{(4-x)}$, wherein x is from 0 to 3,
- fluorodioxoles represented by the formula cyclo-[-(C(R$^1$)(R$^2$))$_x$OCF=CFO-] wherein x is 1 or 2, and R$^1$ and R$^2$ are independently selected from fluorine (F) and linear and branched, saturated perfluoroalkane radicals represented by the formula $-C_xF_{(2x+1)}$, wherein x is from 1 to 5,
- fluoro-1,3-dioxolanes represented by the formula cyclo-[-C(=CF$_2$)OC(F)(R$^1$)CF$_2$O-], and wherein R$^1$ is selected from fluorine (F) and linear and branched, saturated perfluoroalkane radicals represented by the formula $-C_xF_{(2x+1)}$, wherein x is from 1 to 5, fluorodienes represented by the formula $CF_2=CFO(C(F)(R^1))_xCF=CF_2$ wherein x is from 1 to 5, and wherein $R^1$ is selected from fluorine (F) and linear and branched, saturated perfluoroalkane radicals represented by the formula $—C_xF_{(2x+1)}$, wherein x is from 1 to 5, and fluorovinyl hydrofluoroalkyl ethers represented by the formula $CF_2=CFOCH_2R^1$, wherein $R^1$ is hydrogen (H) or linear and branched, saturated radicals represented by the formula $—C_xH_yF_{(2x+1-y)}$ wherein x is from 1 to 5 and y is from 0 to 2x+1.

Specific examples of homopolymerizable fluoromonomers of the present invention include: $CF_2=CF_2$, $CF_2=CFH$, $CF_2=CH_2$, cis- or trans-$CFH=CFH$, $CFH=CH_2$, cyclo-[-$CF_2OCF=CFO$], cyclo-[-$CF_2CF_2OCF=CFO$], cyclo-[-C (F)(CF_3)OCF=CFO$], cyclo-[-C(CF_3)(CF_3)OCF=CFO$], cyclo-[-C (CF_3)(C_2F_5) OCF=CFO$], cyclo-[-C(C_2F_5)(C_2F_5)OCF=CFO$], cyclo-[-C (=CF_2)OCF_2CF_2O$], cyclo-[-C(=CF_2)OC(F)(CF_3)CF_2O$], cyclo-[-C (=CF_2)OC(F)(C_2F_5)CF_2O$], $CF_2=CFOCF_2CF=CF_2$, $CF_2=CFOCF(CF_3)CF=CF_2$, $CF_2=CFOCF_2CF_2CF=CF_2$, $CF_2=CFOCF(CF_3)CF_2CF=CF_2$, $CF_2=CFOCF_2CF(CF_3)CF=CF_2$, $CF_2=CFOCH_2CF_3$, $CF_2=CFOCH_2C_2F_5$, and $CF_2=CFOCH_2CF_2CF_2CF_3$.

The preferred fluoromonomer used in the present process is $CF_2=CF_2$ (tetrafluoroethylene). Tetrafluoroethylene is preferably used in the present process as a mixture of $CF_2=CF_2$ and $CO_2$, a composition which allows for safe transport and handling of $CF_2=CF_2$, and which is described by Van Bramer et al. in U.S. Pat. No. 5,345,013, incorporated herein by reference. A preferred mixture of $CF_2=CF_2$ and $CO_2$ used in the present process comprises equal weights of $CF_2=CF_2$ and $CO_2$.

Non-homopolymerizable fluoromonomers of the present invention include:

perfluoroalkenes represented by the formula $CF_2=CFR^1$, wherein $R^1$ is selected from linear and branched, saturated perfluoroalkane radicals represented by the formula $—C_xF_{(2x+1)}$ wherein x is from 1 to 5, perfluoroalkyl perfluorovinyl ethers represented by the formula $F_2C=CFOR^1$, wherein $R^1$ is selected from linear and branched, saturated perfluoroalkane radicals represented by the formula $—C_xF_{(2x+1)}$ wherein x is from 1 to 5, functionalized perfluorovinyl ethers represented by the formula $F_2C=CFO(CF_2)_xR^1$ or $F_2C=CFOCF_2CF(CF_3)O(CF_2)_xR^1$, wherein x is from 1 to 3 and $R^1$ is $—CH_2OP(=O)(OH)_2$, $—CH_2OH$, $—CH_2OCN$, $—CN$, $—C(=O)OCH_3$ and $—SO_2F$, and perfluorodivinyl ethers represented by the formula $CF_2=CFO(C(F)(R^1))_xOCF=CF_2$, wherein x is from 1 to 5 and $R^1$ is selected from fluorine (F) and linear and branched, saturated perfluoroalkane radicals represented by the formula $—C_xF_{(2x+1)}$ wherein x is from 1 to 5.

Examples of non-homopolymerizable fluoromonomers of the present invention include: $CF_2=CFCF_3$, $CF_2=CFC_2F_5$, $CF_2=CFOCF_3$, $CF_2=CFOC_2F_{F2}C=CFOCF_2CF(CF_3)OCF_2CF_2CH_2OP(=O)(OH)_2$, $F_2C=CFOCF_2CF(CF_3)OCF_2CF_2CH_2OH$, $F_2C=CFOCF_2CF(CF_3)OCF_2CF_2CH_2OCN$, $F_2C=CFOCF_2CF(CF_3)OCF_2CF_2CN$, $F_2C=CFOCF_2CF(CF_3)OCF_2CF_2C(=O)OCH_3$, $F_2C=CFOCF_2CF(CF_3)OCF_2CF_2SO_2F$, $F_2C=CFOCF_2CF(CF_3)OCF_2CF_{F2}C=CFOCF_2CF_2SO_2F$, $CF_2=CFOCF_2CF_2CF_3$, $CF_2=CFOCF_2OCF=CF_2CF_2=CFOCF(CF_3)OCF=CF_2$, $CF_2=CFOCF_2CF_2OCF=CF_2$, and $CF_2=CFOCF(CF_3)CF_2OCF=CF_2$.

Free radical polymerization initiators of the present process comprise initiators that can form free radicals which initiate polymerization of the fluoromonomer and result in formation of a fluoropolymer layer on the thin film device. Initiators are preferably delivered to the thin film device in the gas phase, however it is contemplated that initiators may be present on, or integral with, the surface of the thin film device.

Free radical polymerization initiators of the present process include peroxides, saturated alkyl halides, haloalkenes, halogens and inorganic halides.

Peroxide initiators of the present invention contain at least one peroxide functional group (—OO—) and may be represented by $R^1OOR^2$, wherein $R^1$ and $R^2$ are independently selected from saturated hydrocarbon radicals which may further comprise halogen, oxygen and nitrogen atoms. Hydrocarbon peroxides such as di-t-butylperoxide may be used as initiator in the present process. Perfluorodiacyl peroxides wherein $R^1$ and $R^2$ are $R_FC(=O)—$ and $R_F$ is a perfluorocarbon radical which may contain oxygen, may be used as initiator in the present process. Preferred of the perfluorodiacyl peroxide initiators are those produced from hexafluoropropylene oxide, such as $(CF_3CF_2CF_2OCF(CF_3)CO_2)_2$.

Saturated alkyl halide initiators of the present process may be represented by R—X wherein X is a halogen, preferably fluorine, and R is a hydrocarbon radical, and preferably branched (a secondary or tertiary radical). Preferably R is fluorinated and more preferably R is perfluorinated. Saturated alkyl halide initiators include, for example, perfluorotetramethyl butane $CF_3(C(CF_3)_2)_2CF_3$ as well as perfluorocarbon iodides such as $F(C_2F_4)_xI$, wherein x is from 1–4.

Haloalkene initiators of the present invention are represented by $R^1R^2C=CR^3R^4$, wherein $R^1$ through $R^4$ are independently selected from hydrogen; halogen; alkyl radicals substituted with hydrogen, halogen and heteroatoms such as oxygen and nitrogen; and ether radicals represented by —OR, wherein R is an alkyl radical substituted with hydrogen, halogen and heteroatoms such as oxygen and nitrogen. Preferably, at least one of $R^1$ through $R^4$ is fluorine. In one embodiment of the present process, fluoromonomer acts as the free radical polymerization initiator under the conditions that the fluoromonomer is contacting the thin film device. In such an embodiment, tetrafluoroethylene ($CF_2=CF_2$) may be used as the fluoromonomer, and perfluoroalkyl vinyl ethers such as perfluoropropyl perfluorovinyl ether ($CF_2=CFOCF_2CF_2CF_3$) may be used as a free radical polymerization initiator. Without wishing to be bound by theory, it is believed that in this embodiment a small portion of fluoromonomer thermally decomposes under the conditions that the fluoromonomer is contacting the thin film device and forms free radical species which initiate polymerization of the fluoromonomer.

Halogen initiators of the present invention include molecular fluorine, chlorine, bromine and iodine. Fluorine, especially fluorine highly diluted in an inert gas such as nitrogen, is preferred among the halogen initiators.

Inorganic halide initiators of the present invention include nitrogen trifluoride and sulfur hexafluoride.

The present invention is a process for forming a fluoropolymer layer on a thin film device, and in part involves contacting said thin film device with a gas phase fluoromonomer.

The total pressure during contacting of the gas phase fluoromonomer with the thin film device is not critical and may be from about 101 kPa (1 atmosphere) to about 10.1 kPa (0.1 atmosphere) and preferably from about 101 kPa to about 70 kPa. The total pressure may partly comprise the partial pressures of carrier, purge, and other process gases such as nitrogen, carbon dioxide and noble gases. In a preferred embodiment of the present process, the free radical polymerization initiator is in the gas phase and is reacted with the gas phase fluoromonomer at or near the surface of the thin film device and thus contributes to the total pressure.

The mole ratio of free radical polymerization initiator to fluoromonomer necessary to initiate and maintain an acceptable rate of polymerization of fluoromonomer is not critical and depends on a number of parameters (e.g. the contacting conditions, the chemical constitution of the fluoromonomer and free radical polymerization initiator used, the desired properties of the fluoropolymer layer) but is generally from about 1:100 to 1:100,000.

The temperature during contacting of the gas phase fluoromonomer with the thin film device is not critical and is generally maintained from about 20° C. to about 500° C. and preferably maintained from about 300° C. to about 500° C.

The present invention is a process for forming a fluoropolymer layer on a thin film device, and in part involves initiating polymerization of fluoromonomer with free radical polymerization initiator. Without wishing to be bound by theory, it is believed that fluoromonomer polymerizes on the surface of the thin film device by a free radical, chain propagation mechanism initiated by free radicals arising from bond homolysis in the free radical polymerization initiator under the described contacting conditions.

In an embodiment of the present process where the free radical polymerization initiator is in the gas phase, the process involves mixing the gas phase fluoromonomer and gas phase free radical polymerization initiator to form a gas phase mixture of fluoromonomer and free radical polymerization initiator. Mixing of the gases may occur by any process, but preferably occurs by diffusion following the direction of gaseous streams of the fluoromonomer and initiator into the same volume. Mixing may be controlled to occur prior to or during contacting of the gases with the thin film device.

In a preferred embodiment of the present process, gas phase fluoromonomer and gas phase free radical polymerization initiator may be delivered to the surface of the thin film device by chemical vapor deposition means. The gases are distributed over the surface of the thin film device so that the fluoromonomer and radicals formed from the free radical polymerization initiator react and form a fluoropolymer layer on the surface of the device. The function of the chemical vapor deposition means is to distribute the gases to the surface of the thin film device in a substantially controlled manner. The chemical vapor deposition means preferably provides a substantially controlled flow profile of gases at a controlled flow rate to a particular surface area of the thin film device. The chemical vapor deposition means may also contain features which allow for control of premixing and reaction of the gases prior to their contacting the thin film device. Controlled distribution of the gases promotes complete, efficient and homogeneous reaction of the gases at the surface of the thin film device. Such controlled distribution provides for greater control over the properties and quality of the resultant fluoropolymer layer. For example, such controlled distribution results in uniformity of important fluoropolymer layer properties such as thickness and dielectric constant over large diameter, thin film devices. When the fluoropolymer layer is not of uniform composition and thickness, the proper functioning or further functionalization of the thin film device may be impaired.

In a preferred embodiment of the invention, the present process may be carried out using chemical vapor deposition means having a linear injector as taught by DeDontney et al. in U.S. Pat. No. 5,683,516, herein incorporated by reference. The linear injector comprises an elongated member with end surfaces and at least one gas delivery surface extending along the length of the member and which includes a number of elongated passages formed therein. Also formed within the member are a number of thin distribution channels which extend between the elongated passages and the gas delivery surface. In another configuration of linear injector, a number of metering tubes may be inserted into each elongated passage and are spaced from the walls of said passages and extend between the ends. The metering tubes may contain openings of varying form and dimension which may be directed away from the distribution channels. The metering tubes receive a gas which is conveyed along the metering tubes, whereby the gas flows out of the openings, and is conveyed through the corresponding distribution channel and is directed in a substantially controlled manner along the length of the gas delivery surface. In the instance where a number of gases such as fluoromonomer and free radical polymerization initiator are employed, the distribution channels direct the distribution of such gases to a controlled region on the surface of a thin film device where mixing of the gases is desired. In addition the distribution channels prevent potential chemical fouling of the injector by preventing premature reaction of gases which are particularly reactive under the chosen contacting conditions. The gases are directed to a desired region above or on the thin film device where they mix, react and form a uniform fluoropolymer layer on the thin film device positioned beneath the injector.

In another embodiment of the invention, the present process may be carried out using chemical vapor deposition means having an annular injector as taught by Young et al. in U.S. Pat. No. 5,851,294, herein incorporated by reference. The annular injector comprises a plenum body having at least one plenum formed therein and a plurality of nozzles for injecting fluoromonomer and initiator gases into a processing chamber. The nozzles are spaced from the plenum and are positioned and configured to provide a uniform distribution of gases across the thin film device where they mix, react and form a uniform fluoropolymer layer on the thin film device.

In another embodiment of the present process, the process of the present invention may be carried out in a contoured plate reactor as taught by Mahawill in U.S. Pat. No. 4,834,022, herein incorporated by reference. The contoured plate reactor is approximately cylindrical in shape. The base of the reactor is inclined at an angle of approximately 3°–5° from the vertical and has a central platform with a recessed well. The thin film device is placed in the well so that the surface of the device on which the fluoropolymer is deposited does not protrude above the platform surface. The fluoromonomer and initiator gases are mixed in a region adjacent the cylindrical wall of the reactor and flow radially inward across the device surface where they mix, react and form a uniform fluoropolymer layer on the thin film device.

In another embodiment of the invention, the present process is carried out in a sub-atmospheric pressure tool using a Multiblock™ injector as taught in Miller and Dobkin, U.S. Pat. No. 6,022,414 (FIG. 18), herein incorporated by reference. The advantage of this type of injector is that it has a plurality of injector members and vent members to increase throughput in a production CVD tool.

EXAMPLES

In the following examples: slm refers to standard liters per minute; sccm refers to standard cubic centimeters per minute.

Example 1

Polytetrafluorethylene (PTFE) film was deposited on an 8" diameter, 750 μm thick, P-doped silicon wafer from Wafer Net, Inc. (San Jose, Calif., USA), using an atmospheric pressure CVD tool.

A Monoblok® (Monoblok is a trade mark of ASML Thermal Division, Scotts Valley, Calif., USA) linear injector as described in U.S. Pat. No. 5,683,516 was used to apply laminar reactant and initiator gas flows at a precisely metered rate to the wafer surface as it moved on a conveyor belt under the injector body through a heated, horizontal tunnel (muffle).

In this example, an equal weight mixture of tetrafluoroethylene (TFE) and $CO_2$ at a flow rate of 8 slm was flowed through the separator ports of the Monoblok® linear injector while di-tert-butylperoxide (tbpo) vapor was delivered to the center port of the injector using a liquid bubbler system. The tbpo vapor stream comprised about 5 sccm tbpo vapor achieved by flowing $N_2$ gas at a controlled flow rate of 50 sccm through a bubbler containing tbpo at room temperature.

The injector-conveyor belt spacing was 11 mm, the muffle setpoint temperature was 400° C., and the belt speed was 0.5 inch per minute (ipm). A PTFE film of average thickness 3,645 Å was deposited on the wafer. C-V plots @ 1 MHz gave a dielectric constant ('k')=2.2, while thermal oxide "control" wafers had k=4.0.

Example 2

PTFE film was deposited at atmospheric pressure using a Monoblok® linear injector using $F_2$ as the initiator. In this case, a commercially available 5% $F_2$ in $N_2$ mixture was used. In order to achieve appreciable flows through the injector, this low flow of $F_2$ in $N_2$ was diluted with an additional flow of $N_2$ (called D1 $N_2$). Eight slm of a gas being an equal weight mixture of tetrafluoroethylene (TFE) and $CO_2$ was metered into the center (inner) port, the outer ports had 50 sccm of 5% $F_2$ in $N_2$+7.95 slm of D1 $N_2$ flow, and the separator ports of the Monoblok™ linear injector had 16 slm of $N_2$ flow. The muffle was heated to a 250° C. setpoint, sufficient to thermally crack molecular fluorine into atomic F. The belt speed was 0.5 ipm.

ESCA analysis was performed on the PTFE thin film deposited on the wafer. The elemental composition proved to be 31.4% C and 68.6% F.

The 2:1 ratio of F:C is indicative of polytetrafluorethylene. No other elements were detected by ESCA. Moreover, chemical shifts indicated that all the fluorine was bonded to C atoms, and carbon was bonded either to other carbon atoms or to fluorine atoms, as expected for PTFE.

Example 3

In this example PTFE was deposited using $NF_3$ as the initiator. Thermal cracking of $NF_3$ requires temperatures over 700° C. to generate atomic F radicals. A heater was located upstream of the injector to heat the incoming $NF_3$ to temperatures >700° C. Although built in-house, this heater was similar in construction to the commercially available Watlow Starflow™ Heater. The atomic F generated by this heat reacted with the TFE gas coming out of the injector slot to cause polymerization at the wafer surface.

Details of this experiment follow: TFE flow rate=5 slm through the inner port, 50 sccm of $NF_3$+1.00 slm of D1 $N_2$ flowed through the outer ports, while 1.00 slm of separator $N_2$ came through the separator ports of the Monoblok® linear injector. The upstream heater was set @ 740° C., while the muffle setpoint was 500° C.

In this case, a static deposition was done with the wafer stalled under the injector for a total time of 20 minutes. This experiment resulted in an average thickness of 174 Å and a maximum thickness of 1194 Å.

Example 4

This example of PTFE deposition using an atmospheric pressure chemical vapor deposition (APCVD) tool with a Monoblok®linear injector used 30% $H_2O_2$ in a bubbler for initiation of the proprietary TFE gas mixture. In this case, 4.4 slm of TFE is controllably flowed through the center port, 1.2 slm of bubbler $N_2$ is flowed through the outer ports (with entrained $H_2O_2$), 1.0 slm of separator $N_2$ is used. The muffle setpoint was 500° C., and a 60 minute static deposition was done. A PTFE film was deposited, with maximum thickness of 2575 Å and a refractive index (n)=1.376 as measured on a Rudolph spectroscopic ellipsometer.

Example 5

In this example PTFE film was deposited at atmospheric pressure using Trigonox-C™ as the initiator. This is a product of Akzo Nobel Polymer Chemicals LLC. A Monoblok® linear injector was used. A gas being an equal weight mixture of tetrafluoroethylene (TFE) and $CO_2$ was flowed at a rate of 8 slm through the separator ports of the linear injector while a liquid bubbler system using $N_2$ gas as a carrier at 3 slm brought Trigonox-C™ through the center port of the injector.

The injector-conveyor belt spacing was 11 mm, the muffle setpoint temperature was 400° C., the belt speed was 0.25 ipm, and the exhaust setpoint was 0.25 in. $H_2O$. A single pass through the deposition zone resulted in a coating of 3005 Å and a refractive index (n)=1.37.

Example 6

In order to demonstrate the effect of line speed on the PTFE deposition, an experiment similar to Example #1 was performed, except that the line speed was increased to 1 inch per minute, the exhaust setpoint was 0.25, and a total of 3 passes were done to compensate for the reduced residence time in the deposition zone. A film of 1844 Å was deposited at this higher line speed; furthermore, the film quality (as measured by the Rudolph spectroscopic ellipsometer goodness-of-fit) was improved over that produced at lower line speeds.

Example 7

In this example, an APNext™ (APNext is a trademark of ASML Thermal Division, Scotts Valley, Calif., USA) sub-atmospheric pressure CVD tool was used for depositing a PTFE film. This tool uses a heated vacuum chuck to hold an 8" silicon wafer while the chuck translates under the fixed injector body to improve film uniformity. A 2x injector was used (2 injectors housed in a single body), and deposition was done at 600 Torr in the process chamber, using the following conditions:

"monomer" flow rate (1:1 wt ratio of TFE:$CO_2$)=12 slm bubbler $N_2$ flow rate (di-tert-butylperoxide is room temperature initiator)=50 sccm chuck temperature=400° C.

chuck translate speed=0.4 mm/second chuck-injector gap spacing=6 mm passes=1 (deposition time=27.5 minutes)

$N_2$ chamber purge=4 slm $N_2$ ballast flow=40 slm (into pump foreline)

Slot $N_2$ purge flow=8 slm (inner)/4 slm (outer)

5 wafers were coated using the process above, with the following results:

1. Average thickness as deposited=2731 Å (1σ=206 Å)
2. Average refractive index=1.33 (1σ=0.04)
3. Average thickness after 10' anneal (380° C., in vacuo)= 2638Å(1σ=256Å)

What is claimed is:

1. A process for forming a fluoropolymer layer on a thin film device, comprising:
   a.) delivering a gas phase fluoromonomer and a gas phase free radical polymerization initiator to said thin film device,
   b.) mixing said gas phase fluoromonomer and said gas phase free radical polymerization initiator to form a gas phase mixture of said fluoromonomer and said free radical polymerization initiator,
   c.) contacting said thin film device with said gas phase mixture of said fluoromonomer and said free radical polymerization initiator, and
   d.) initiating polymerization of said fluoromonomer with said free radical polymerization initiator, whereby said fluoromonomer polymerizes to form said fluoropolymer layer on said thin film device.

2. The process of claim 1 wherein the delivering of a gas phase fluoromonomer and a gas phase free radical polymerization initiator to said thin film device is by chemical vapor deposition means.

3. The process of claim 1 wherein the fluoropolymer layer is 500 angstroms to about 50,000 angstroms thick.

4. The process of claim 1 wherein the fluoromonomer is selected from the group consisting of fluoroethylenes represented by the formula $C_2H_xF_{(4-x)}$, wherein x is from 0 to 3, fluorodioxoles represented by the formula cyclo-[-(C($R^1$)($R^2$))$_x$OCF=CFO-] wherein x is 1 or 2, and $R^1$ and $R^2$ are independently selected from fluorine (F) and linear and branched, saturated perfluoroalkane radicals represented by the formula —$C_xF_{(2x+1)}$, wherein x is from 1 to 5, fluoro-1,3-dioxolanes represented by the formula cyclo-[-C(=$CF_2$)OC(F)($R^1$)$CF_2$O-], and wherein $R^1$ is selected from fluorine (F) and linear and branched, saturated perfluoroalkane radicals represented by the formula —$C_xF_{(2x+1)}$, wherein x is from 1 to 5, fluorodienes represented by the formula $CF_2$=CFO(C(F)($R^1$))$_x$CF=$CF_2$ wherein x is from 1 to 5, and wherein $R^1$ is selected from fluorine (F) and linear and branched, saturated perfluoroalkane radicals represented by the formula —$C_xF_{(2x+1)}$, wherein x is from 1 to 5, and fluorovinyl hydrofluoroalkyl ethers represented by the formula $CF_2$=CFOCH$_2R^1$, wherein $R^1$ is hydrogen (H) or linear and branched, saturated radicals represented by the formula —$C_xF_{(2x+1)}$ wherein x is from 1 to 5 and y is from 0 to 2x−1.

5. The process of claim 1 wherein the fluoromonomer is tetrafluoroethylene.

6. The process of claim 1 wherein the free radical polymerization initiator is selected from the group consisting of peroxides, saturated alkyl halides, haloalkenes, halogens and inorganic halides.

7. The process of claim 1 wherein the initiating step is performed at a pressure of about 101 kPa to about 10.1 kPa, at a temperature of about 20° C. to about 500° C., and a mole ratio of free radical polymerization initiator to fluoromonomer of about 1:100 to about 1:100,000.

8. The process of claim 2 wherein the chemical vapor deposition means is selected from the group consisting of linear injector, annular injector, a contoured plate reactor, and a sub-atmospheric pressure tool using a Multiblock™ injector.

* * * * *